United States Patent
Miyata

(10) Patent No.: US 6,573,612 B1
(45) Date of Patent: Jun. 3, 2003

(54) RESIN-ENCAPSULATED SEMICONDUCTOR DEVICE INCLUDING RESIN EXTENDING BEYOND EDGE OF SUBSTRATE

(75) Inventor: Koji Miyata, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/534,176

(22) Filed: Mar. 24, 2000

(30) Foreign Application Priority Data

Jul. 30, 1999 (JP) ............................................ 11-216109

(51) Int. Cl.⁷ .......................... H01L 23/28; H01L 23/48; H01L 23/52; H05K 1/02
(52) U.S. Cl. ........................ 257/788; 257/737; 257/738; 257/784; 257/786; 257/787; 257/693; 257/678; 257/780; 257/774
(58) Field of Search .................................... 257/678, 734, 257/737, 738, 777–781, 784, 786, 672, 690–693, 698, 774, 787, 788

(56) References Cited

U.S. PATENT DOCUMENTS

| | | | |
|---|---|---|---|
| 5,216,278 A * 6/1993 | Lin et al. | ...................... | 257/688 |
| 5,541,450 A * 7/1996 | Jones et al. | .................. | 257/738 |
| 5,557,150 A * 9/1996 | Variot et al. | ................. | 257/787 |
| 5,874,784 A * 2/1999 | Aoki et al. | ................... | 257/738 |
| 5,990,545 A * 11/1999 | Schueller et al. | ........... | 257/738 |
| 5,994,773 A * 11/1999 | Hirakawa | .................... | 257/668 |
| 6,097,101 A * 8/2000 | Sato et al. | ................... | 257/787 |
| 6,172,419 B1 * 1/2001 | Kinsman | | |
| 6,181,002 B1 * 1/2001 | Juso et al. | ................... | 257/738 |
| 6,198,165 B1 * 3/2001 | Yamaji et al. | ............... | 257/738 |
| 6,204,559 B1 * 3/2001 | Lin et al. | ..................... | 257/738 |
| 6,232,650 B1 * 5/2001 | Fujisawa et al. | ............ | 257/666 |
| 6,261,869 B1 * 7/2001 | Radford et al. | ............. | 438/123 |
| 6,265,783 B1 * 7/2001 | Juso et al. | ................... | 257/786 |
| 6,291,895 B1 * 9/2001 | Taniguchi et al. | ........... | 257/738 |
| 6,308,894 B1 * 10/2001 | Hirai et al. | .................. | 235/492 |
| 6,329,606 B1 * 12/2001 | Freyman et al. | ............ | 438/112 |
| 6,365,432 B1 * 4/2002 | Fukutomi et al. | ........... | 438/106 |
| 2001/0013647 A1 * 8/2001 | Hsu et al. | .................... | 257/738 |

FOREIGN PATENT DOCUMENTS

| | | |
|---|---|---|
| JP | 10-92979 | 4/1998 |
| JP | 11-340249 | * 12/1999 |
| JP | 2001-85564 | * 3/2001 |

OTHER PUBLICATIONS

Satoshi Takabayashi et al., Technical Report of IEICE, CPM98–166, 1998–12, "FBGA/CSP flexible assembly lines with whole–cavity . . . ", pp. 59–65.

* cited by examiner

Primary Examiner—Alexander O. Williams
(74) Attorney, Agent, or Firm—Nixon & Vanderhye P.C.

(57) ABSTRACT

A process for fabricating a resin-encapsulated semiconductor device comprises the steps of: (a) forming a plurality of first through holes for external connection in a substrate for mounting semiconductor chips; (b) forming a conductive film on a chip-mounting surface of the substrate and patterning the conductive film into a plurality of patterned wirings and a plurality of lands which cover the entire openings of the first through holes and partially constitute the patterned wirings; (c) mounting two or more semiconductor chips on the chip-mounting surface of the substrate; (d) mounting external connection terminals at the first through holes from a terminal-mounting surface opposite to the chip-mounting surface and connecting the semiconductor chips to the external terminals through the lands; (e) encapsulating the two or more semiconductor chips in one-piece with a resin encapsulant; (f) cutting the substrate with a first cutting blade from the terminal-mounting surface of the substrate; (g) cutting the resin encapsulant with a second cutting blade thinner than the first cutting blade; and (h) dividing the resulting substrate for the individual semiconductor chips.

4 Claims, 9 Drawing Sheets

RESIN-ENCAPSULATED SEMICONDUCTOR DEVICE INCLUDING RESIN EXTENDING BEYOND EDGE OF SUBSTRATE

CROSS-REFERENCE TO RELATED APPLICATION

This application is related to Japanese application No. HEI11-216109 filed on Jul. 30, 1999, whose priority is claimed under 35 USC §119, the disclosure of which is incorporated by reference in its entirety.

BACKGROUND OF THE INVENTION

1. Field of the Invention

The present invention relates to a resin-encapsulated semiconductor device and a process for fabricating the same. More particularly, it relates to a resin-encapsulated semiconductor device of a ball grid array (BGA) type which is called a chip size package (CSP), and a process for fabricating the same.

2. Related Art

Conventionally, resin-encapsulated semiconductor devices of the BGA type called CSP as shown in FIG. 9(c) have been widely utilized.

The resin-encapsulated semiconductor device comprises a wiring substrate 25 for mounting a semiconductor chip which includes thereon a patterned wiring 26, a plurality of first through holes 31 for external connection and a plurality of lands 27 for external connection which cover the entire openings of the first through holes 31 and partially constitute the patterned wiring 26, and a semiconductor chip 21 mounted thereon. The semiconductor chip 21 is electrically connected to the patterned wiring 26 through wire bonding using an Au wire 23. The semiconductor chip 21 and the Au wire 23 are encapsulated with a resin 22 for encapsulation. Further, external terminals 24 for external connection are mounted on a surface opposite to a chip-mounting surface of the wiring substrate 25 and electrically connected to the semiconductor chip 21 via the lands 27.

The resin-encapsulated semiconductor device is fabricated by the following process.

First, the first through holes 31 for mounting the external terminals are formed in an area array matrix of the wiring substrate 25.

On a surface of the wiring substrate 25 where the semiconductor chips 21 are to be mounted, the patterned wiring 26 and the lands 27 for external connection are formed of a conductive film, and marks 30 representative of cutting lines are formed of the conductive film in the periphery of the wiring substrate 25. The lands 27 partially serve as the patterned wiring 26 and cover the respective first through holes 31.

Then, the semiconductor chips 21 are mounted on the wiring substrate 25 and electrically connected to the patterned wiring 26 formed on the wiring substrate 25 through wire bonding using Au wires 23.

The semiconductor chips 21 arranged on the wiring substrate 25 and the Au wires 23 are all encapsulated in one-piece with the resin 22 by a transfer mold technique.

Then, the encapsulated semiconductor chips 21 are divided into individual chips. At this time, as shown in FIG. 9(a), a surface of the wiring substrate 25 where the external terminals are to be mounted is adhered to a jig 33 for fixing the wiring substrate. The chip-mounting surface of the wiring substrate 25 is faced upward so that the marks 30 of cutting lines can be observed from the chip-mounting surface side of the wiring substrate 25. The cutting line is defined by joining a pair of marks 30 formed on the opposite sides of the periphery of the wiring substrate 25. The resin 22 and the underlying wiring substrate 25 are cut and divided with a single cutting blade 29 along the cutting line in one operation as shown in FIG. 9(b).

Thereafter, as shown in FIG. 9(c), the external terminals 24 are mounted at the first through holes 31 from the external terminal mounting surface and subjected to a reflow process to metallically bond the external terminals 24 and the patterned wiring 26 or the lands 27. Thus, an end product is obtained.

In the above-described fabrication process, the semiconductor chips 21 encapsulated with the resin 22 on the wiring substrate 25 are divided into individual chips 21 by cutting. That is, the wiring substrate 25 and the resin 22 formed of different materials are cut in one operation with one cutting blade 29. Therefore, the cutting blade 29 is extremely worn out.

Further, since cut faces of the resin 22 and the wiring substrate 25 are in the same plane, the resin encapsulant 22 and the wiring substrate 25 may be separated from each other at an interface therebetween.

SUMMARY OF THE INVENTION

The present invention provides with a process for fabricating a resin-encapsulated semiconductor device comprising the steps of: (a) forming a plurality of first through holes for external connection in a substrate for mounting semiconductor chips; (b) forming a conductive film on a chip-mounting surface of the substrate and patterning the conductive film into a plurality of patterned wirings and a plurality of lands which cover the entire openings of the first through holes and partially constitute the patterned wirings; (c) mounting two or more semiconductor chips on the chip-mounting surface of the substrate; (d) mounting external connection terminals at the first through holes from a terminal-mounting surface opposite to the chip-mounting surface and connecting the semiconductor chips to the external terminals through the lands; (e) encapsulating the two or more semiconductor chips in one-piece with a resin encapsulant; (f) cutting the substrate with a first cutting blade from the terminal-mounting surface of the substrate; (g) cutting the resin encapsulant with a second cutting blade thinner than the first cutting blade; and (h) dividing the resulting substrate for the individual semiconductor chips.

Further, the present invention provides with a resin-encapsulated semiconductor device comprising; a substrate for mounting a semiconductor chip including thereon a patterned wiring, a plurality of first through holes for external connection and a plurality of lands which cover the entire openings of the first through holes and partially constitute the patterned wiring, a semiconductor chip mounted on the substrate, the semiconductor chip being encapsulated with a resin, and terminals for external connection being mounted on a surface opposite to a chip-mounting surface of the substrate and electrically connected to the semiconductor chip through the lands, wherein an edge of the substrate is positioned inside an edge of the resin for encapsulation.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1(a) to 6(a) are schematic plan views of a semiconductor device observed from the chip-mounting surface and FIGS. 1(b) to 6(b) are schematic plan views of the semiconductor device observed from the external terminal mounting surface for illustrating an example of the process for fabricating a resin-encapsulated semiconductor device according to the present invention.

DESCRIPTION OF THE PREFERRED EMBODIMENTS

Figure 1A:
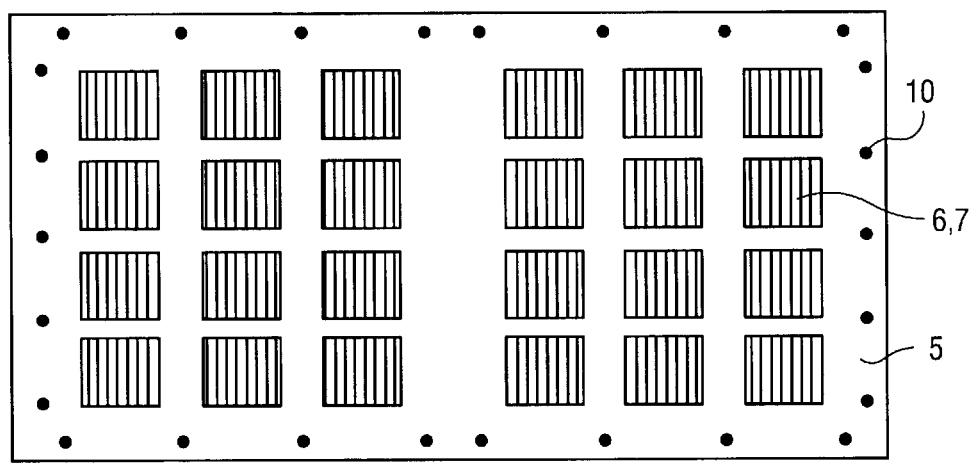

According to the process for fabricating the resin-encapsulated semiconductor device of the present invention, a plurality of first through holes for external connection are formed in a substrate for mounting semiconductor chips in the step (a).

The substrate used in the present invention is not particularly limited and any substrate commonly used for mounting resin-encapsulated semiconductor devices can be used. Examples thereof include polyimide resins, glass-reinforced epoxy resins, glass, epoxy resins, ceramics and the like. Among these, glass-reinforced epoxy resins and polyimide resins are preferable. The thickness of the substrate is not particularly limited, but a thickness of about 0.1 to 2.0 mm is mentioned.

The first through holes formed in the substrate are used for electrically connecting a semiconductor chip to external terminals. The size, number and arrangement of the through holes are determined as appropriate in accordance with the size of the external terminals; the shape, size and performance of the semiconductor chip or the resin-encapsulated semiconductor device to be obtained and the like. For example, in the case of a semiconductor chip of about 10 mm×10 mm, about 20 to 500 through holes having a diameter of about 0.25 mm to 0.45 mm may be formed.

The first through holes can be formed in the substrate by a known technique, for example, sputtering or the like.

In the present invention, it is preferable to form a plurality of second through holes which can serve as marks of cutting positions simultaneously with the formation of the first through holes. The size of the second through holes may be the same as or different from the size of the first through holes as long as they can be recognized as the marks. The second through holes are preferably formed in the internal periphery of the substrate. It is more preferable to form the second through holes along the sides of the substrate at even intervals (for example, intervals slightly greater than the length of a side of a semiconductor chip to be mounted) so that one semiconductor chip is located in a region defined by four lines provided by joining second through hole pairs formed along the opposite sides of the substrate.

Then, in the step (b), a conductive film is formed on a chip-mounting surface of the substrate and patterned into a plurality of patterned wirings and a plurality of lands which entirely cover the openings of the first through holes and partially constitute the patterned wirings.

The conductive film may be formed of any material commonly used as an electrode. For example, the conductive film may be a single layer or a laminated layer of metals such as gold, copper, nickel, chromium, tungsten, iron, molybdenum. The thickness of the conductive film may be, for example, about 15 $\mu$m to 30 $\mu$m.

The patterned wirings and the lands may be formed by a known patterning technique such as photolithography and etching. The shape, size and number of the patterned wirings and the lands may be determined as appropriate in accordance with the shape, size and performance of the semiconductor chip or the resin-encapsulated semiconductor device to be obtained. Here, the lands need to be patterned to cover the entire openings of the first through holes. Depending on the performance and the like of the semiconductor chip or the resin-encapsulated semiconductor device, the lands may be patterned such that one land covers one first through hole or alternatively one land covers a plurality of first through holes.

If the second through holes are formed in the previous step, the conductive film is preferably patterned to cover the entire openings of the second through holes at the same time of the patterning of the wirings and the lands. In this case, one conductive film may be patterned such that one trace of the pattern covers one second through hole or a plurality of second through holes.

In the step (c), two or more semiconductor chips are mounted on the chip-mounting surface of the substrate.

The semiconductor chips need to be mounted on the substrate by using an adhesive such as epoxy resin so that wirings, terminals such as pad electrodes formed on the front or the rear surface of the chips can be electrically connected to the patterned wirings, lands and the like formed on the substrate. For example, the terminals on the semiconductor chips can be connected to the lands on the substrate through an adhesive containing a conductive material, and connected to the patterned wirings on the substrate through wire bonding using wires such as of gold, copper and the like.

In the step (d), the external terminals are mounted at the first through holes from a surface opposite to the chip-mounting surface of the substrate and electrically connected to the semiconductor chips via the lands. The electrical connection between the external terminals and the semiconductor chips may be realized by mounting or inserting the external terminals on or into the first through holes and then subjecting to a reflow process for metallic bonding therebetween. In order to take such a step, the external terminals are suitably in a ball form, cylindrical form or prism form made of a material such as solder, Au or the like. The external terminals preferably have a size greater than the thickness of substrate, i.e., a size such that the external terminals penetrate the first through holes at a final stage.

In the step (e), two or more semiconductor chips are encapsulated in one-piece with the resin for encapsulation. The resin may be achieved by encapsulating all the semiconductor chips mounted on the substrate in one-piece or by dividing the plural semiconductor chips on the substrate into groups of two or more and then encapsulating the individual groups in one-piece. The method of the resin encapsulation may be a common method such as a method in which a mold having a cavity of a predetermined shape is used, or a method of flowing or applying the resin onto the substrate on which the semiconductor chips are mounted. The resin is not particularly limited, but may preferably be a material which does not damage the semiconductor chips, the wirings patterned on the substrate, the bonding wires and the like. Preferable examples thereof include a material which melts at a low temperature, a material having suitable viscosity and/or a material which cures in a suitable period under suitable conditions. More specifically, epoxy resin and the like are used. The thickness of the resin can be appropriately adjusted in accordance with the size of the semiconductor chips or the semiconductor device to be obtained, but suitably be a thickness of about 0.4 mm to 1.0 mm from the substrate surface, for example.

In the step (f), the substrate is cut from the terminal-mounting surface of the substrate using a first cutting blade. Then, in the step (g), the resin is cut using a second cutting blade thinner than the first cutting blade.

The first cutting blade is used for cutting the substrate, and preferably, more suitable for cutting the substrate than for cutting the resin. More specifically, the first cutting blade is a disc-shaped rotating member in which abrasive grains of a predetermined particle size are fixed on the outside circumference thereof. An example thereof includes a blade typically used in a dice cutting technique. Examples of abrasive grains include diamond and the like, having an average diameter of about 20 $\mu$m to 60 $\mu$m. The disc-shaped rotating member itself is preferably made of a relatively hard metal or diamond. The thickness of the first cutting blade is, for example, about 150 $\mu$m to 250 $\mu$m.

Where the first cutting blade is used to cut the substrate, it is generally preferable to fix the chip-mounting surface of the substrate, i.e., the resin side, with a jig or the like, and cut the substrate from the terminal-mounting surface by recognizing and using the second through holes as reference marks indicative of cutting positions. Accordingly, the substrate can be precisely cut to have a predetermined shape from the terminal-mounting surface side. Further, the first cutting blade is preferably stopped at an interface between the substrate and the resin so that only the substrate is cut.

The second cutting blade is a blade mainly for cutting the resin, and preferably, more suitable for cutting the resin than for cutting the substrate. More specifically, the second cutting blade is a disc-shaped rotating member in which abrasive grains having a greater particle size than those on the first cutting blade are fixed on the outside circumference thereof. An example thereof includes a blade typically used in the dice cutting technique. The abrasive grains may have a particle size of about 20 $\mu$m to 60 $\mu$m. Materials for the abrasive grains and the rotating member may be the same as those used for the first cutting blade. The thickness of the second cutting blade is preferably thinner than the first cutting blade, for example, about 100 $\mu$m to 200 $\mu$m.

Where the second cutting blade is used to cut the resin, it is preferable to cut it where the substrate has been cut with the first cutting blade (where the resin has been exposed) from the terminal-mounting surface, so that only the resin is cut.

In the present invention, however, the cutting with the first cutting blade in the step (f) and the cutting with the second cutting blade in the step (g) may be reversed. More specifically, the substrate and the resin are cut first with the second cutting blade from the terminal-mounting surface by recognizing and using the second through holes as reference marks indicative of cutting positions, and then only the substrate is cut again with the first cutting blade where the second cutting blade has cut. Accordingly, the cut faces of the substrate and the resin are prevented from constituting the same plane.

The steps (f) and (g) allow the division of the obtained substrate into individual semiconductor chips such that the cut faces of the substrate and the resin are prevented from constituting the same plane.

In the resin-encapsulated semiconductor device of the present invention, a peripheral edge of the substrate is positioned inside a peripheral edge of the resin. That is, the outer circumference of the resin in which the semiconductor chip is encapsulated is larger than that of the substrate on which the semiconductor chip is mounted. The distance between the edge of the substrate and the edge of the resin is suitably about 20 $\mu$m to 50 $\mu$m, for example. In other words, the area of the substrate on which the semiconductor chip is mounted assumes about 80% to 90% of the area occupied by the resin-encapsulated semiconductor device, and the edge of the substrate is preferably positioned inside the edge of the semiconductor device.

Hereinafter, the resin-encapsulated semiconductor device and the fabrication process thereof will be explained with reference to the drawings.

The resin-encapsulated semiconductor device according to the present invention comprises a wiring substrate 5 including thereon a patterned wiring 6, a plurality of first through holes 14 for external connection and a plurality of lands 7 for external connection which cover the entire openings of the first through holes 14 and partially constitute the patterned wiring 6, and a semiconductor chip 1 mounted thereon. The semiconductor chip 1 is electrically connected to the patterned wiring 6 through wire bonding using an Au wire 3. The semiconductor chip 1 and the Au wire 3 are encapsulated with a resin 2 for encapsulation. Further, external terminals for external connection 4 are mounted on a surface opposite to the chip-mounting surface of the wiring substrate 5 and electrically connected to the semiconductor chip 1 via the lands 7.

Figure 7A:
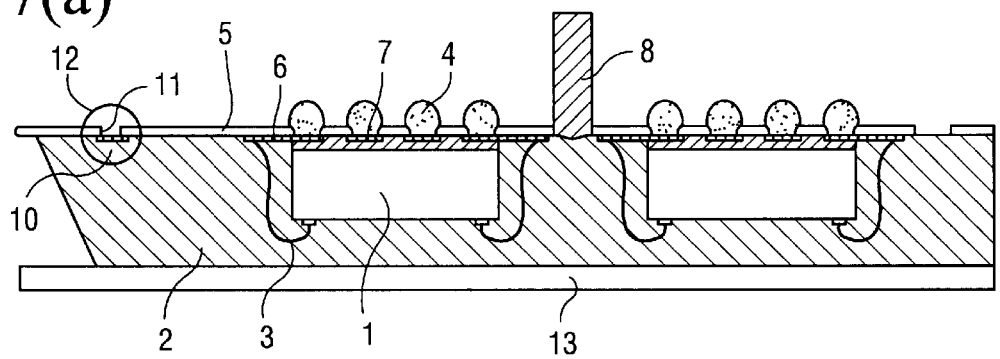
FIGS. 7(a) to 7(c) are schematic sectional views of the semiconductor device for illustrating the example of the process for fabricating the resin-encapsulated semiconductor device according to the present invention.
Figure 7B:
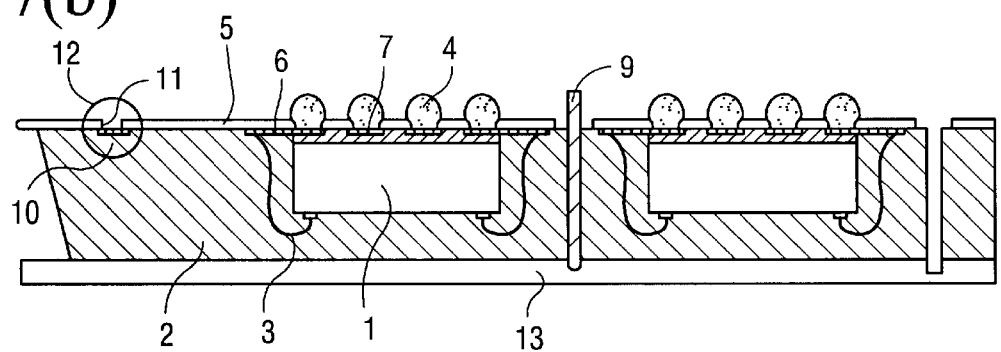
Figure 7C:
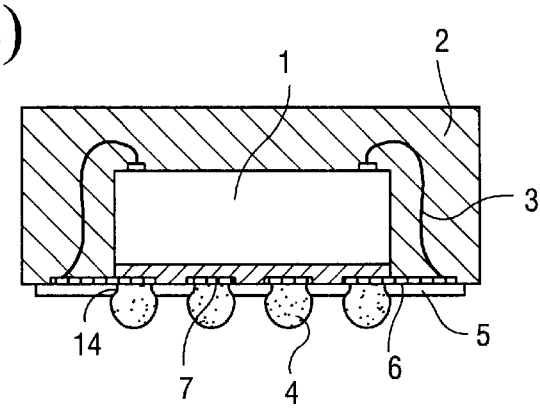

The size of the semiconductor chip shown in FIG. 7(c) is about 7 mm×9 mm. Edges of the wiring substrate 5 are positioned about 25 $\mu$m inside edges of the resin encapsulant 2.

The resin-encapsulated semiconductor device is fabricated by the following steps.

Figure 1B:
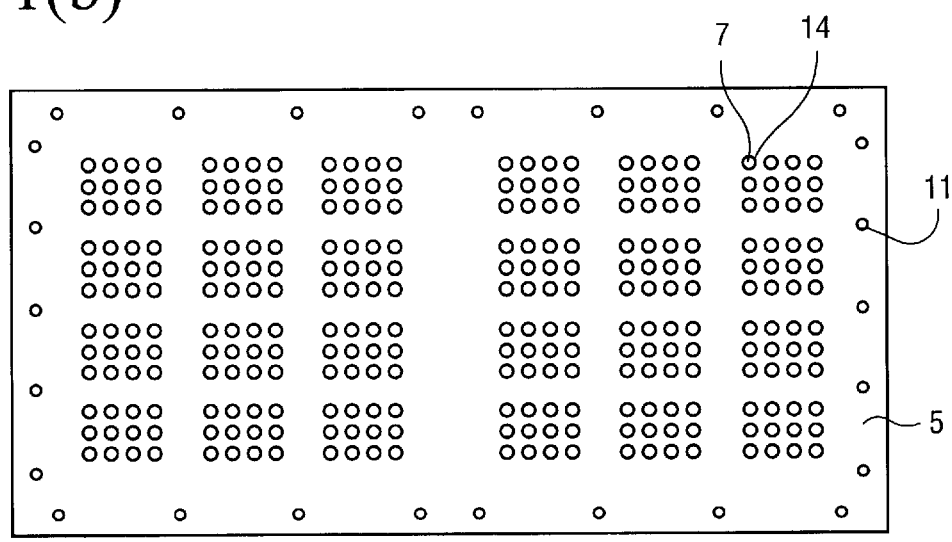

First, as shown in FIGS. 1(a) and 1(b), a plurality of first through holes 14 for mounting the external terminals are formed in an area array matrix of the wiring substrate 5 of polyimide resin, and second through holes 11 which serve as marks indicative of cutting positions in a later step are formed in the internal periphery of the wiring substrate 5. Then, a conductive film is entirely formed on surface where the semiconductor chips 1 are to be mounted, and the patterned wiring 6 and the lands 7 which partially constitute the patterned wiring 6 are formed. Simultaneously, a conductive pattern 10 is formed to cover the entire openings of the second through holes 11.

Figure 2A:
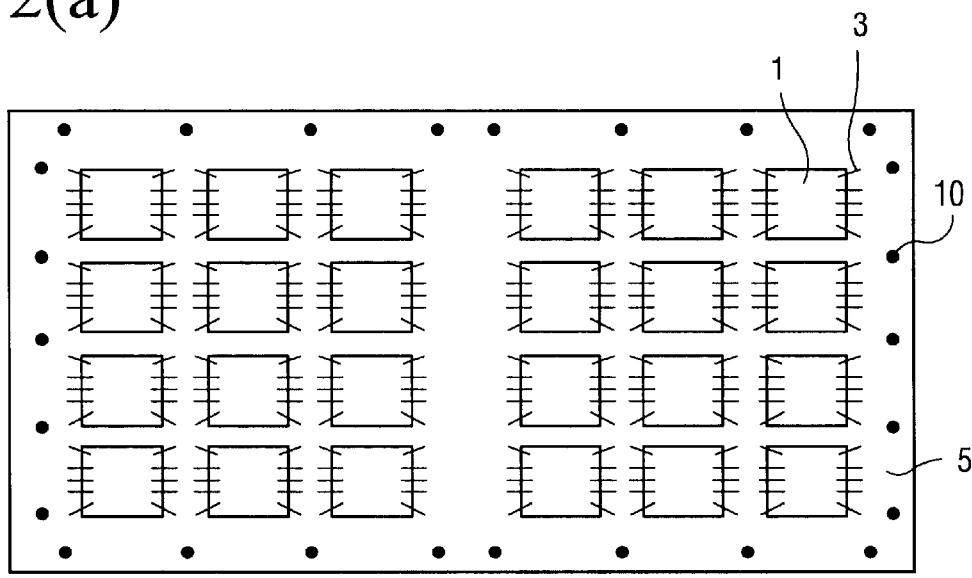
Figure 2B:
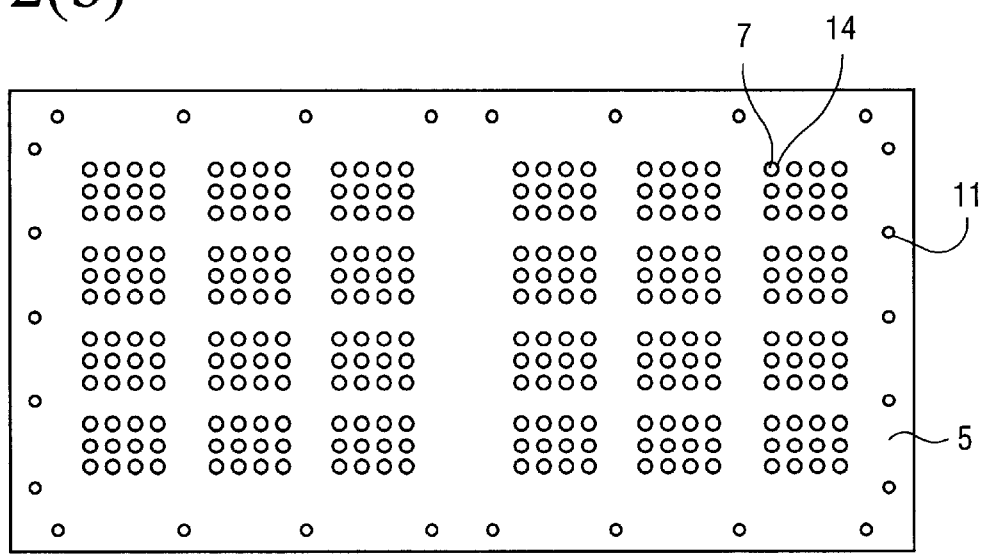

Next, as shown in FIGS. 2(a) and 2(b), the semiconductor chips 1 are adhered to the wiring substrate 5 with an adhesive paste or film (for example, polyimide). Then, the resulting substrate 5 adhered with the chips 1 is entirely heated at a predetermined temperature (ex., 200° C.) for a predetermined period (ex., 60 minutes). Then, the heated substrate 5 with the chips 1 is washed by plasma treatment to modify the surface property thereof so that the stability of the wire bonding is improved. Subsequently, electrode pads (not shown) of the semiconductor chips 1 are connected to terminals (not shown) of the patterned wiring 6 through the Au wires 3.

Figure 3A:
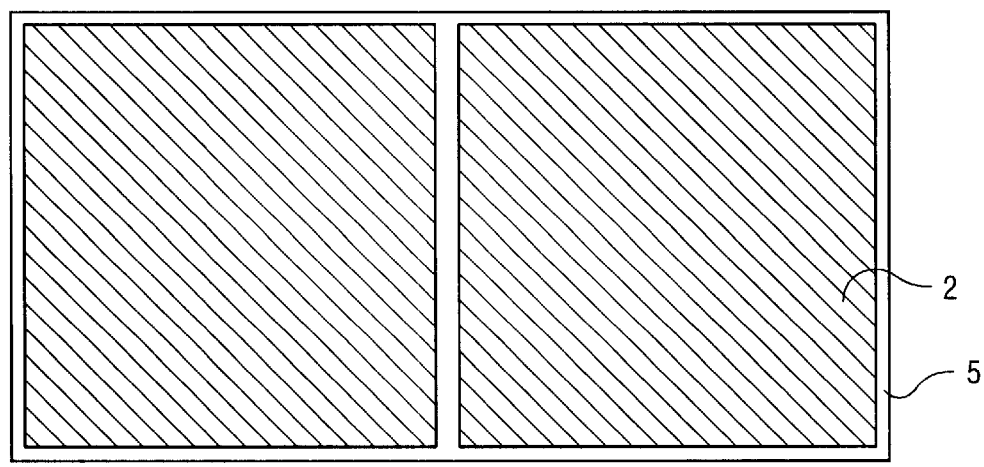
Figure 3B:
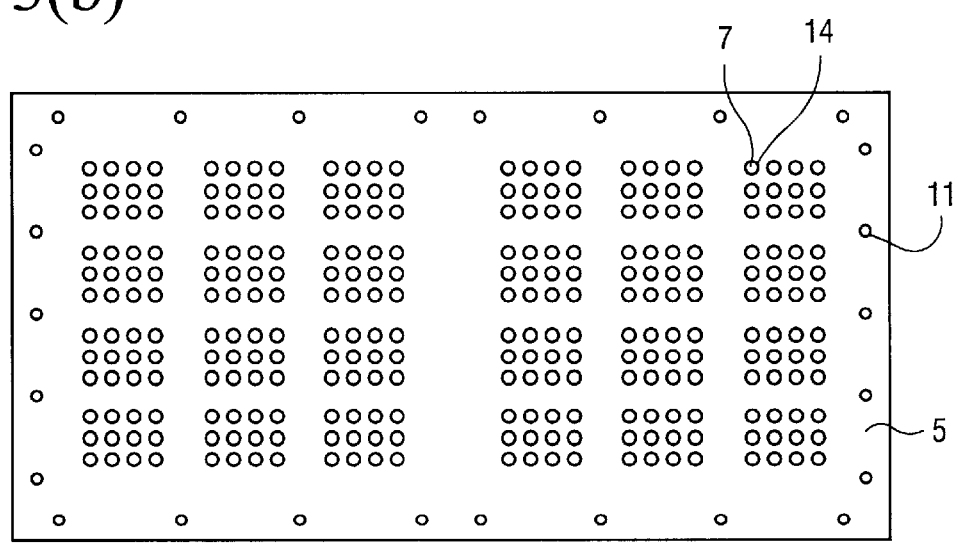

Then, as shown in FIGS. 3(a) and 3(b), the semiconductor chips 1 and the Au wires 3 are encapsulated with the resin 2 of epoxy resin by a transfer mold technique.

Figure 8A:
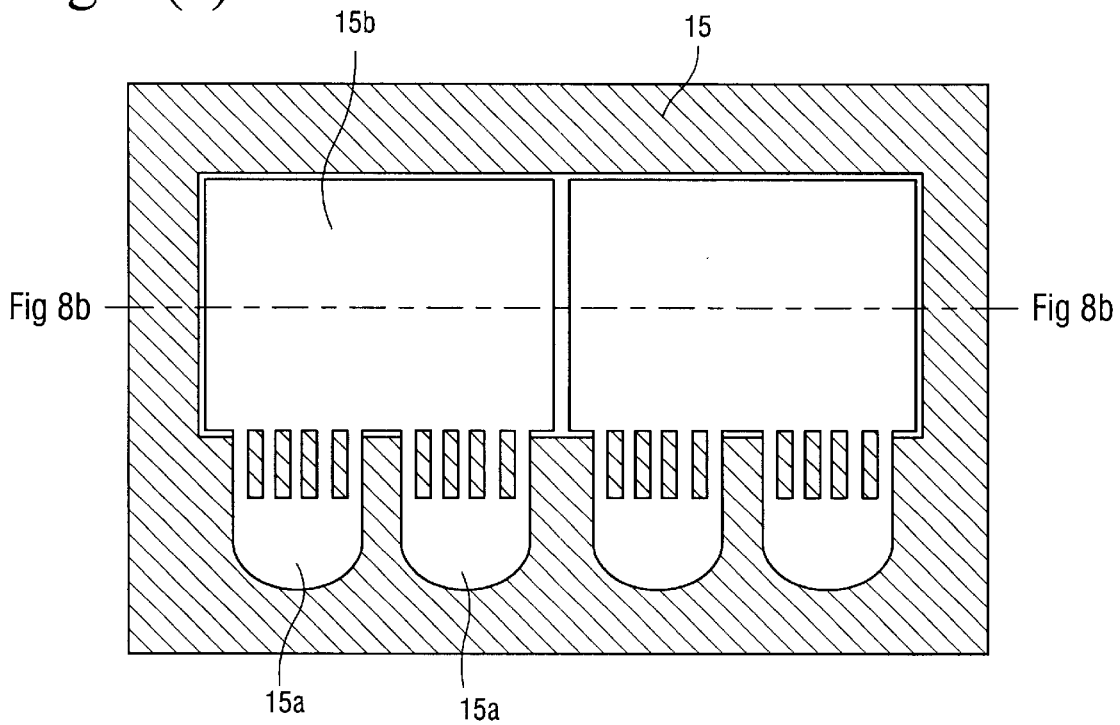
FIG. 8(a) is a plan view illustrating a mold for resin encapsulation used in the example of the process for fabricating the resin-encapsulated semiconductor device according to the present invention.
Figure 8B:
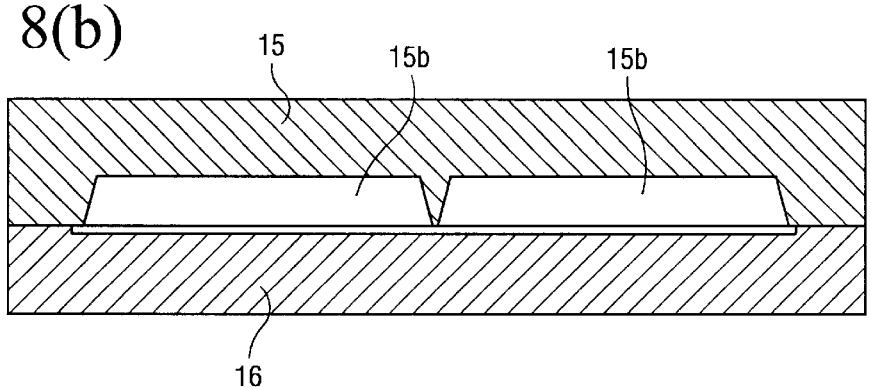
FIG. 8(b) is a side cross sectional view of the mold of FIG. 8(a).
Figure 9A:
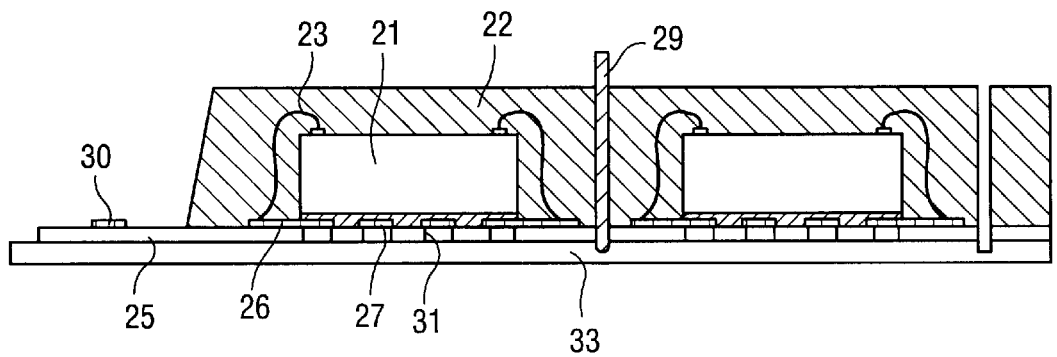
FIGS. 9(a) to 9(c) are schematic sectional views illustrating a conventional process for fabricating a resin-encapsulated semiconductor device.
Figure 9B:
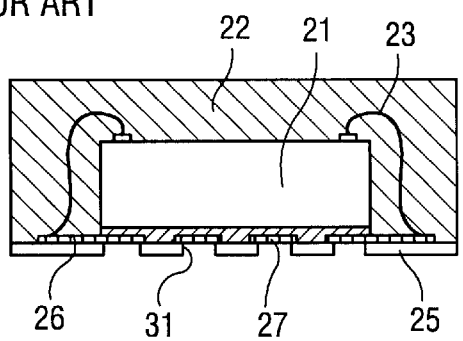
Figure 9C:
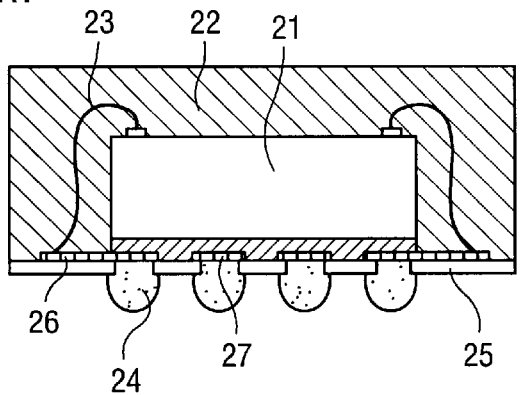

At this time, as shown in FIGS. 8(a) and 8(b), the wiring substrate 5 is sandwiched and fixed between a holding member 16 and a mold 15 whose inside is divided into two spaces 15b. Thus, the semiconductor chips 1 mounted on the wiring substrate 5 are divided into two groups and each of the groups is encapsulated in one operation by injecting the resin 2 from spaces 15a to the spaces 15b.

Thereafter, the resin-encapsulated wiring substrate 5 is heated at a predetermined temperature (ex., 175° C.) for a predetermined period (ex., 300 minutes). Further, in order to inhibit warpage of the semiconductor device, it is preferable that a gap between the two resin 2 and 2 (where the wiring substrate 5 is exposed) is perpendicular to a lengthwise direction of the wiring substrate 5.

Figure 4A:
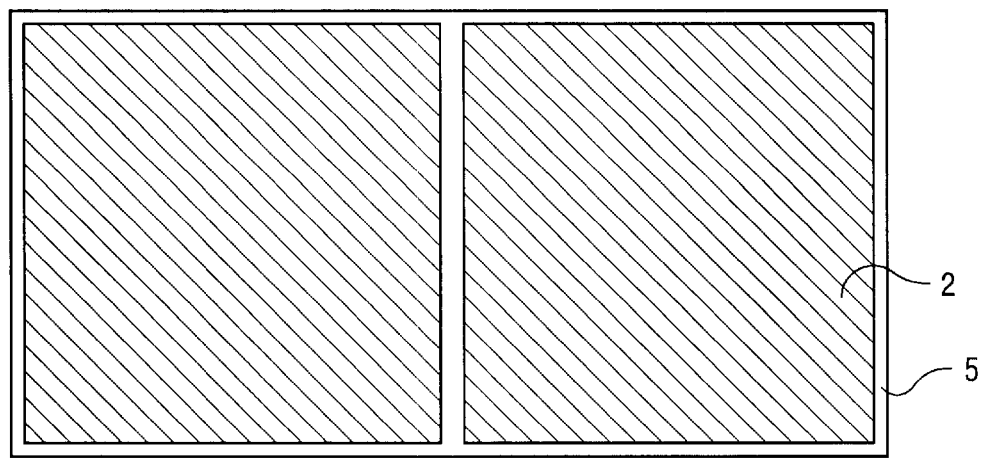
Figure 4B:
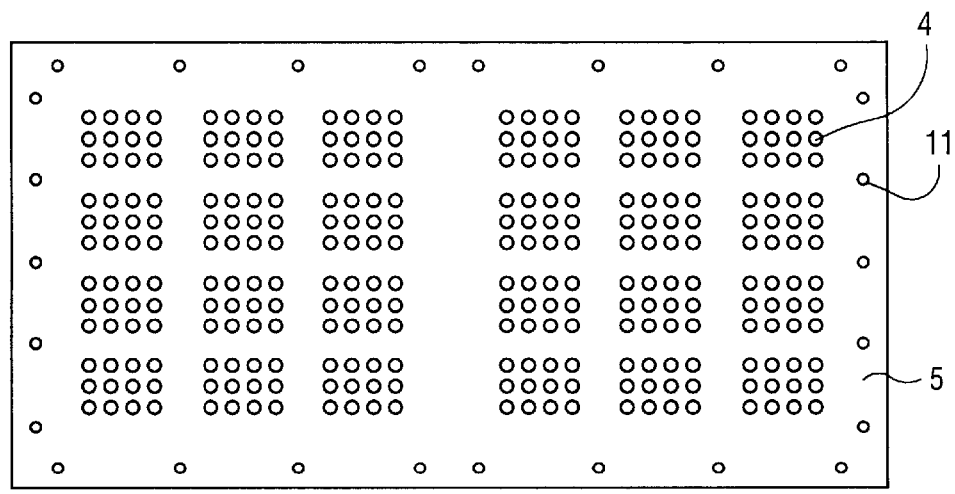
Figure 5A:
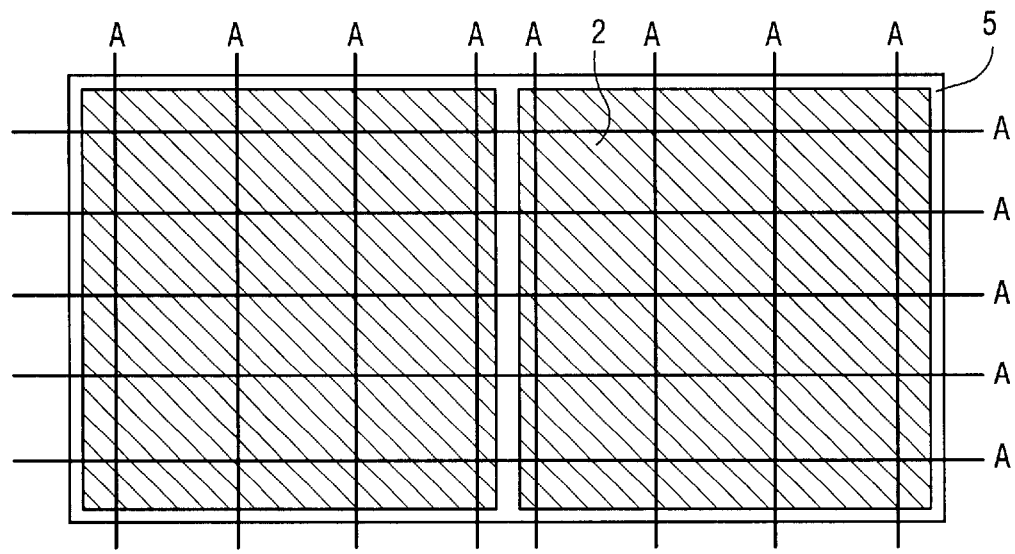
Figure 5B:
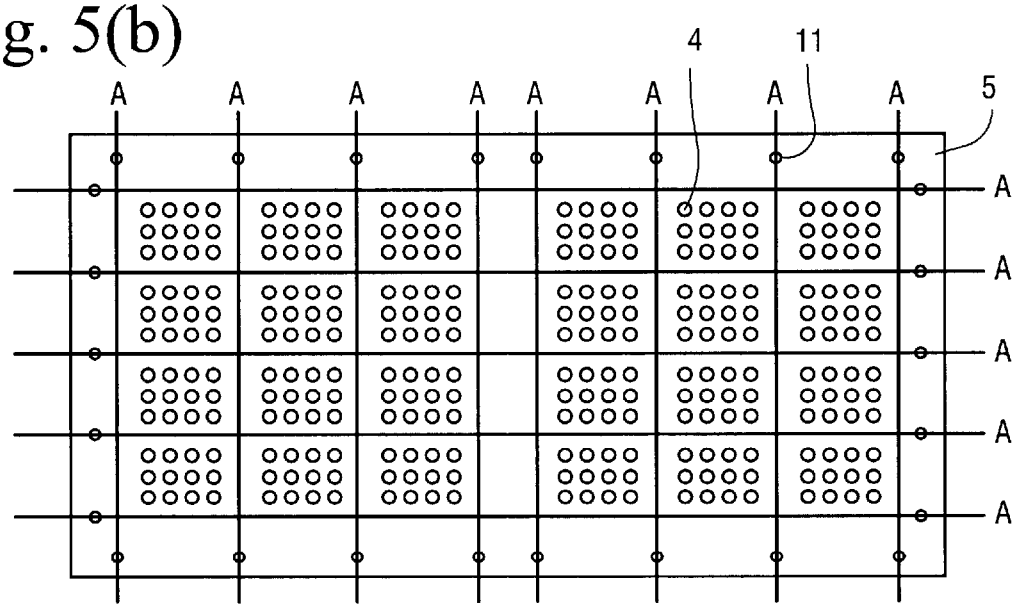

Then, as shown in FIGS. 4(a) and 4(b), the external terminals 4 are mounted at all of the first through holes 14 from a chip-mounting surface of the wiring substrate 5 in one operation. Subsequently, the external terminals 4 and the lands 7 are metallically bonded by a reflow process.

Then, as shown in FIGS. 5(a), 5(b), 7(a) and 7(b), the terminal-mounting surface of the wiring substrate 5 is faced upward and the resin side of the wiring substrate 5 is adhered to a jig 13 for fixing the substrate. Subsequently, from the terminal-mounting surface, the marks of cutting positions comprised of the conductive patterns 10 and the second through holes 11 are observed. Lines A provided by joining pairs of marks formed at opposite edges of the wiring substrate 5 are defined as cutting lines. Then the resin 2 and the wiring substrate 5 are cut with cutting blades 8 and 9 along the lines A.

For the cutting, only the wiring substrate 5 is cut first with the first cutting blade 8 and then only the resin 2 is cut with the second cutting blade 9 at positions where the wiring substrate 5 has been cut, thereby to divide into the individual semiconductor chips 1.

The first cutting blade 8 used herein is suitable for cutting the wiring substrate 5 and comprises a rotating member of diamond provided with abrasive diamond grains having an average particle size of 8 μm. The thickness of the blade is 200 μm. The second cutting blade 9 is suitable for cutting the resin 2 and comprises a rotating member of diamond provided with abrasive diamond grains having an average particle size of 20 μm. The thickness thereof is thinner than the first cutting blade 8 (150 μm).

Figure 6A:
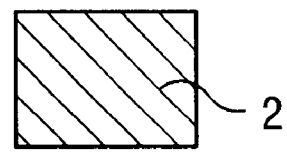
Figure 6B:
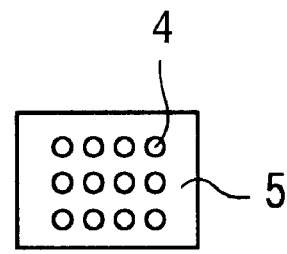

Then, as shown in FIGS. 6(a), 6(b) and 7(c), resin-encapsulated semiconductor devices thus divided individually are detached from the jig 13 for fixing the substrate, and end products are obtained.

According to the process for fabricating the resin-encapsulated semiconductor device of the present invention, the substrate is cut with the first cutting blade from the terminal-mounting surface and the resin is cut with the second cutting blade thinner than the first cutting blade at a position where the substrate has been cut, so that the sections of the substrate and the resin do not assume the same plane. This enables a facilitated fabrication of resin-encapsulated semiconductor devices which are adapted to prevent or inhibit exfoliation of the substrate from the resin.

In particular, where a plurality of semiconductor chips are divided into two or more groups which are each encapsulated in one-piece with a resin, warpage of the obtained resin-encapsulated semiconductor devices can be reduced.

Where the first cutting blade is more suitable for cutting the substrate than for cutting the resin and the second cutting blade is more suitable for cutting the resin than for cutting the substrate, that is, where the first cutting blade is a disc-shaped rotating member provided with abrasive grains having a predetermined particle size and the second cutting blade is a disc-shaped rotating member provided with abrasive grains having a particle size greater than those of the first cutting blade, the conventional problem of cutting blades being worn out can be reduced and production costs can also be reduced.

Where a plurality of second through holes are formed in the internal periphery of the substrate simultaneously with the formation of the first through holes and the substrate is cut with the first cutting blade while regarding the second through holes as marks of cutting positions, the positional relationship of the semiconductor chips encapsulated within the resin can be precisely understood from the arrangement of the second through holes. Therefore, positions at which the substrate is cut or divided can be controlled, and thereby, yield can be improved.

According to the resin-encapsulated semiconductor device of the present invention, the edge of the substrate is positioned inside the edge of the resin. Therefore, semiconductor devices which are adapted to prevent or reduce the peeling-off of the substrate from the resin and have stable quality can be produced with improved and at lower costs.

What is claimed is:

1. A resin-encapsulated semiconductor device comprising:
   a substrate for mounting a semiconductor chip including thereon a patterned wiring, a plurality of first through holes for external connection and a plurality of lands which cover the entire openings of the first through holes and partially constitute the patterned wiring, said substrate being planar so as to define a plane,
   a semiconductor chip mounted on the substrate, the semiconductor chip being encapsulated with a resin,
   terminals for external connection being mounted on a surface opposite to a chip-mounting surface of the substrate and electrically connected to the semiconductor chip through the lands, and
   wherein a peripheral edge of the substrate is positioned inside a peripheral edge of the resin for encapsulation so that the peripheral edge of the resin extends over and beyond the peripheral edge of the substrate, and wherein the resin does not extend into the plane defined by the substrate.

2. A resin-encapsulated semiconductor device according to claim 1, wherein a lateral distance between the peripheral edge of the substrate and the peripheral edge of the resin is from about 20 μm to 50 μm, so that the peripheral edge of the resin extends beyond the peripheral edge of the substrate by said distance.

3. The semiconductor device of claim 1, wherein a first cutting blade is used to cut at least the substrate and a different wider second cutting blade is used to cut the resin after the substrate has been cut, so that the peripheral edge of the resin extends over and beyond the peripheral edge of the substrate because the first cutting blade has a wider cutting width than the second cutting blade.

4. A resin-encapsulated semiconductor device comprising:

a substrate for mounting a semiconductor chip, the substrate including thereon a patterned wiring, a plurality of first through holes for external connection and a plurality of lands which at least partially cover the openings of the first through holes and at least partially constitute the patterned wiring, a semiconductor chip mounted on the substrate, the semiconductor chip being encapsulated with a resin, terminals for external connection being mounted on a surface opposite to a chip-mounting surface of the substrate and electrically connected to the semiconductor chip through the lands, and wherein at an interface where the substrate abuts and contacts the resin a peripheral edge of the substrate is positioned inside a peripheral edge of the resin so that at least part of the peripheral edge of the resin extends beyond the peripheral edge of the substrate and the resin does not extend into a plane defined by the substrate.

* * * * *